(12) United States Patent
Saito (10) Patent No.: US 6,727,781 B2
(45) Date of Patent: Apr. 27, 2004

(54) HIGH FREQUENCY AMPLIFIER

(75) Inventor: Akihiko Saito, Nagoya (JP)

(73) Assignee: Daido Steel Co., Ltd., Nagoya (JP)

( * ) Notice: Subject to any disclaimer, the term of this patent is extended or adjusted under 35 U.S.C. 154(b) by 0 days.

(21) Appl. No.: 09/953,404

(22) Filed: Sep. 17, 2001

(65) Prior Publication Data

US 2002/0079115 A1 Jun. 27, 2002

(30) Foreign Application Priority Data

Sep. 18, 2000 (JP) ........................................ 2000-281048

(51) Int. Cl.[7] .................... H03H 11/06; H01P 1/23; H01P 1/215
(52) U.S. Cl. .................... 333/181; 333/12; 333/211
(58) Field of Search ................ 174/35 R, 35 MS; 333/12, 181, 211; 361/818

(56) References Cited

U.S. PATENT DOCUMENTS

| | | | | |
|---|---|---|---|---|
| 3,638,148 A | * | 1/1972 | Hallford et al. | 333/12 X |
| 5,561,265 A | * | 10/1996 | Livshits et al. | 174/35 GC |
| 5,864,088 A | * | 1/1999 | Sato et al. | 174/35 MS |
| 6,048,601 A | * | 4/2000 | Yahagi et al. | 174/35 MS X |

\* cited by examiner

*Primary Examiner*—Robert Pascal
*Assistant Examiner*—Dean Takaoka
(74) *Attorney, Agent, or Firm*—Varndell & Varndell, PLLC (57) ABSTRACT

Disclosed is a high frequency (HF) amplifier to be used at a high frequency, typically in the range of 9 GHz to 12 GHz, in which coupling of input side and output side is prevented to achieve high gain without influence on the fidelity of amplification. The HF amplifier comprises a metal case consisting of a box type container and a lid, an amplifying element installed on a dielectric, insulating board at the bottom of the case, and leads connected to the input circuit and the output circuit of the amplifying element and extending outside through both the end walls of the case. The HF amplifier is characterized by disposition of an electromagnetic wave-absorbing sheet or sheets inside of at least one of both the side walls, the ceiling, and both the end walls so as to prevent electromagnetic coupling.

17 Claims, 10 Drawing Sheets

HIGH FREQUENCY AMPLIFIER

BACKGROUND OF THE INVENTION

The present invention concerns an amplifier used in high frequency (hereinafter abbreviated as "HF"), particularly, in the range of 5–13 GHz, more specifically, in the range of 9–12 GHz, in which electromagnetic coupling between the input circuit and the output circuit of the amplifier is prevented.

Figure 1:
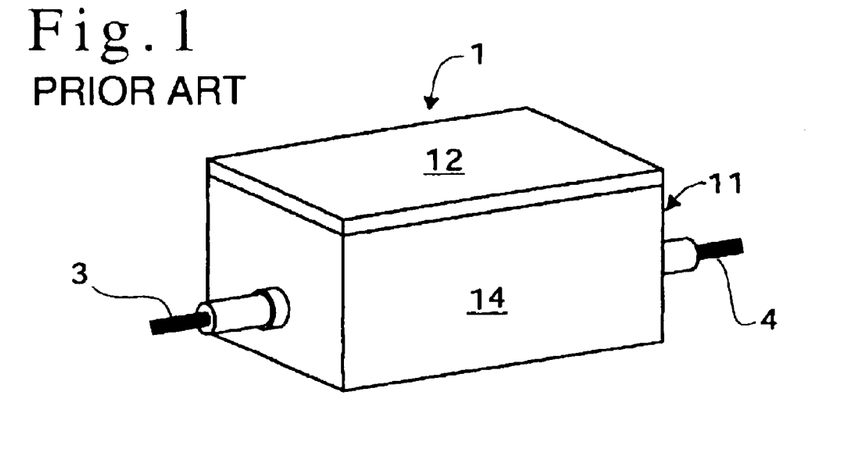
FIG. 1 is an external appearance of a conventional HF amplifier.
Figure 2:
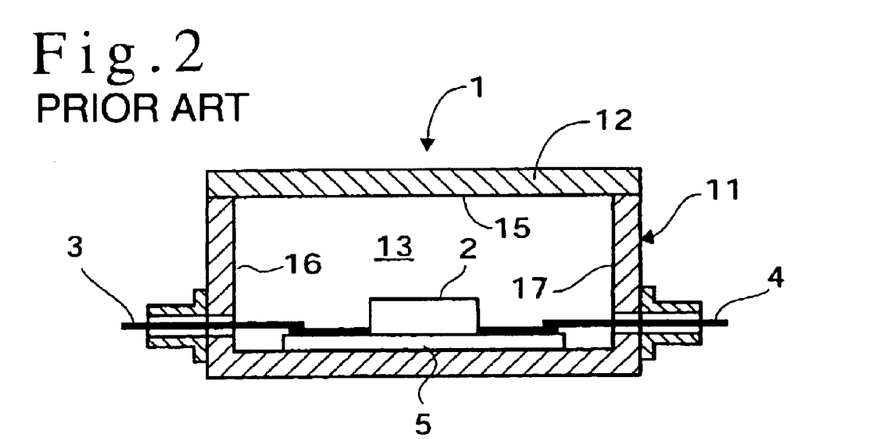
FIG. 2 illustrates an internal structure of the high frequency amplifier of FIG. 1.

Conventional HF-amplifiers have the structure, as shown in FIG. 1 and FIG. 2, of a metal case 1 consisting of a box type container 11 and a lid 12, an amplifying element 2 installed on a dielectric, insulating board 5 in the case, and leads 3 and 4 connected to the input circuit and the output circuit of the amplifying element and extending outside through both one end wall 16 and the opposite end wall 17 of the case.

In this type of HP amplifier it is inevitable that electromagnetic coupling occurs between the input circuit and the output circuit, and there are some problems due to the coupling, such as difficulty in achieving desired gain as well as decrease in fidelity of amplification. Thus, prevention of coupling (hereinafter referred to as "decoupling") is an important technical problem in this kind of HF amplifier.

With the attempt to solve this problem the inventor tried disposing an electromagnetic wave-absorbing material in the metal case consisting of a box type container and a lid, and at the bottom of which an amplifying element is installed on a dielectric, insulating board. Positions to dispose the eletromagnetic absorbing material may be inside both the side walls, inside both the end walls and inside the lid or on the ceiling. The first trial was made on the ceiling. As the electromagnetic wave-absorbing materials there were used the following three kinds of sheets comprising a rubber or plastic as the matrix material and carbon powder, ferrite powder or a soft magnetic metal powder dispersed therein.

Figure 4:
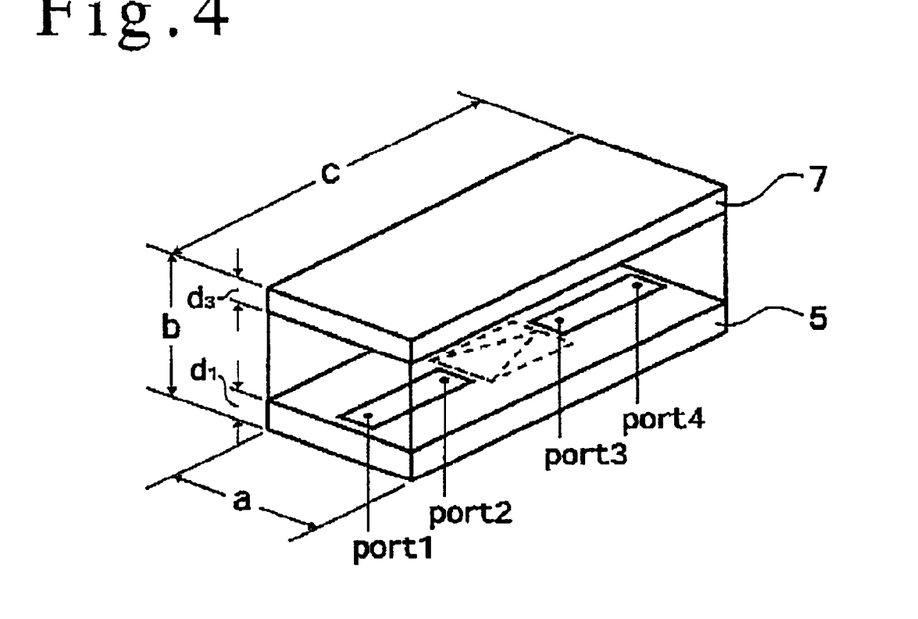
FIG. 4 is a perspective view of the case which is a component of the present HF amplifier, showing the inner dimensions, i.e., width "a", height "b" and length "c"

The survey was carried out at first on the effect of inner dimensions of the metal case, i.e., width "a", height "b" and length "c" as shwon in FIG. 4, on the coupling, and then on the thickness of the dielectric, insulating board 5 on which the amplifying element 2 is installed.

Figure 5:
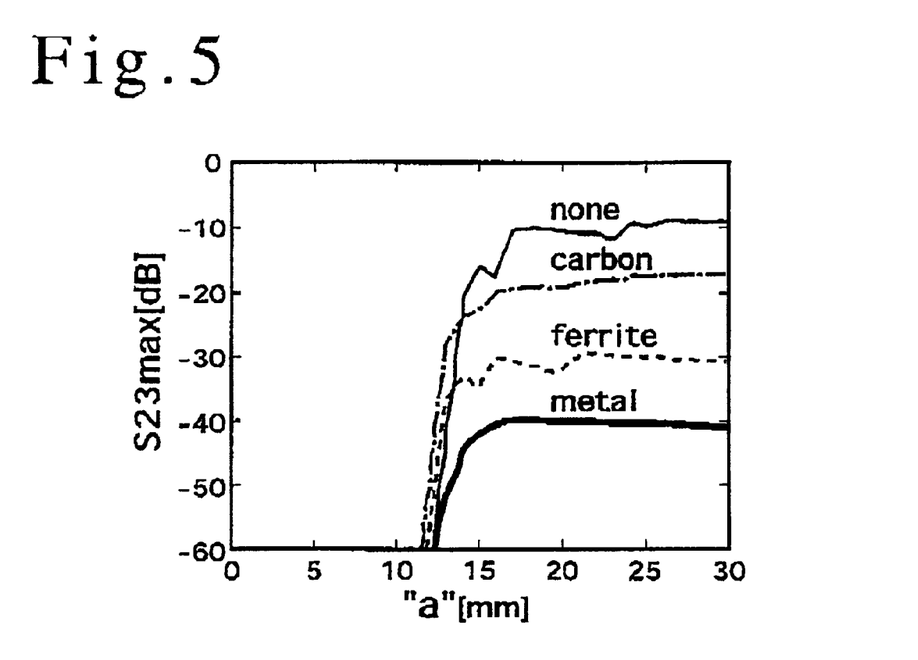
FIG. 5 is a graph showing the relation between the width "a" of the metal case of the present HF amplifier and the effect of decoupling.
Figure 6:
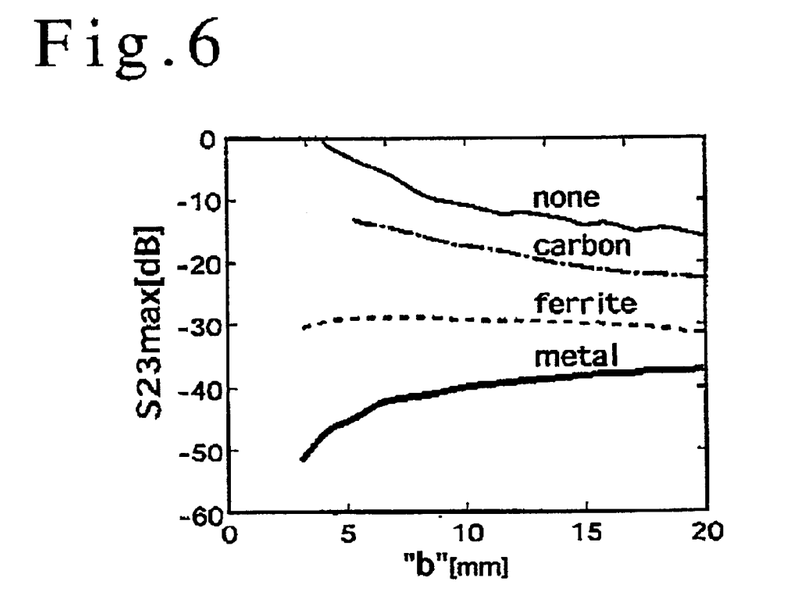
FIG. 6 is a graph showing the relation between the height "b" of the metal case of the present HF amplifier and the effect of decoupling.
Figure 7:
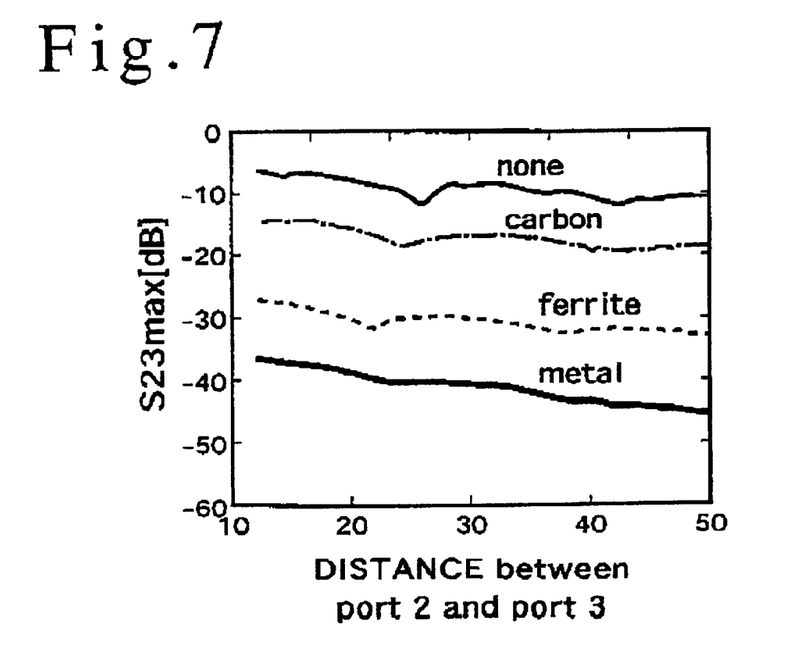
FIG. 7 is a graph showing the relation between the distance of the input lead to the output lead of the present HF amplifier and the effect of decoupling.
Figure 8:
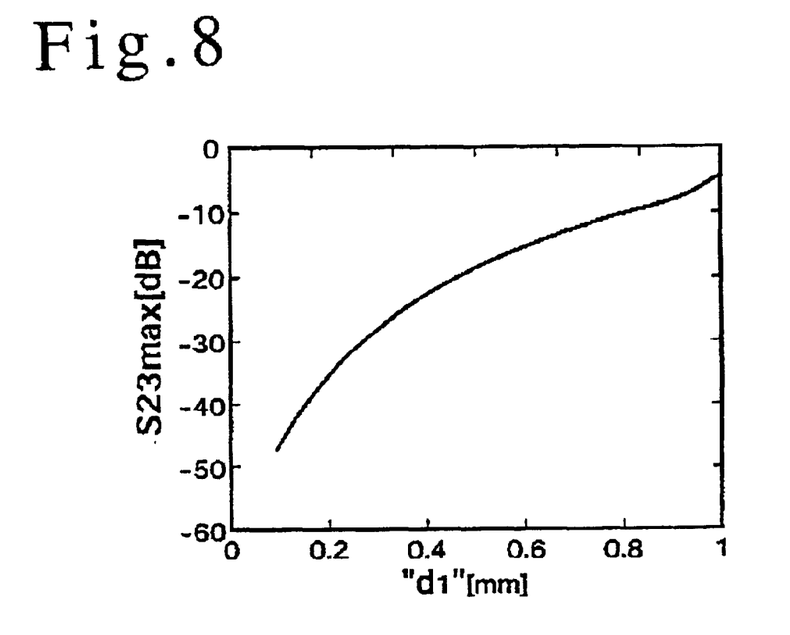
FIG. 8 is a graph showing the relation between the thickness of the dielectric, insulating board on which an amplifying element is installed in the present HF amplifier and the effect of decoupling.

The following facts were found:

1) As the electromagnetic wave-absorbing materials those made by dispersing a soft magnetic metal powder in a rubber matrix and rolling to form sheets, which the inventor has been developing, exhibit good results;
2) In such a small case as the width "a" is 12 mm or less, as seen from the graph of FIG. 5, coupling is not a problem;
3) Regarding the height "b", in case of carbon powder dispersed sheets, the larger the height is, the less the coupling is; In case of ferrite powder dispersed sheets, little influence of the height was appreciated; and in case of soft magnetic metal powder-disperses sheets, a smaller height is favorable from the view to prevent coupling;
4) With respect to the distance between port 2 and port 3 in FIG. 4, as seen from the graph of FIG. 7, in any case of different electromagnetic wave-absorbing material longer port distance between the input circuit and the output circuit will result in decreased coupling; and
5) As to the thickness of the dielectric, insulating board 5 on which the amplifying element 2 is installed, as seen from the graph of FIG. 8, the thinner the board is, the more effective the decoupling is. However, because the insulating board must have certain mechanical strength, about 0.6 mm will be a practical lower limit.

In the HF amplifier in which an electromagnetic wave-absorbing material containing dispersed soft magnetic metal powder on the ceiling of the case the electromagnetic wave which may cause coupling between the input circuit and the output circuit is absorbed by the absorbing material and thus, coupling will be effectively decreased. For example, in the frequency range of 9–12 GHz, amplification of 25 dB can be achieved without decrease of gain caused by coupling.

In order to enable amplification of higher gain without suffering from coupling the inventor continued development, and found the following facts:

6) The decoupling effect is different depending on the positions of disposing the electromagnetic wave-absorbing material in the cases of the HF amplifier;
7) The electromagnetic wave-absorbing sheets prepared by dispersing a soft magnetic metal powder in a rubber matrix have optimum ranges of combination of the powder filling-rate and the thickness of the sheets for the electromagnetic wave-absorption performance; and
8) In the case where the above electromagnetic wave-absorbing sheets are prepared by rolling the absorption characteristics are different depending on the relation between the rolling direction of the sheet and the direction of signal propagation.

SUMMARY OF THE INVENNTION

The object of the present invention is to utilize the above-described novel knowledge obtained by the inventor and to provide an HF amplifier to be used in a frequency range of, typically, 9–12 GHz, which can achieve high gain without suffering from coupling between the input circuit and the output circuit, and to which no influence is given on the amplification fidelity.

Figure 3:
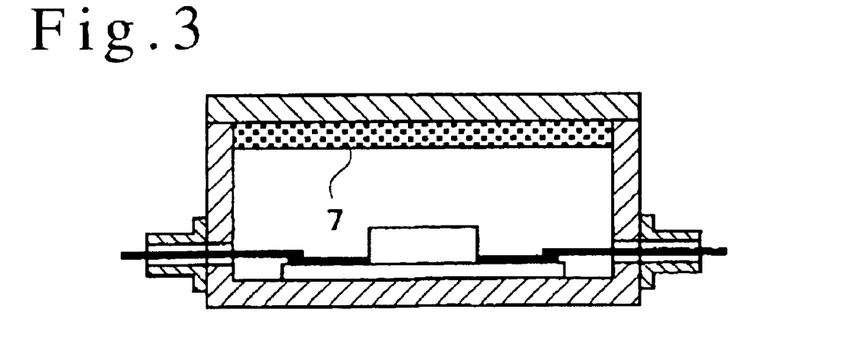
FIG. 3 illustrates an internal structure of the high frequency amplifier according to the invention.

The HF amplifier of this invention has the same components as those of the conventional HF amplifiers, as shown in FIG. 1 and FIG. 2. The components are a metal case 1 consisting of a box type container 11 and a lid 12, an amplifying element 2 installed on a dielectric, insulating board 5 at the bottom of the case, and leads 3 and 4 connected to the input circuit and the output circuit of the amplifying element and extending outside through both one end wall and the opposite end wall of the case. The present HF amplifier is characterized in that an electromagnetic wave-absorbing sheet 7 or sheets are disposed inside of at least one of both the side walls 13 and 14, the ceiling 15, and both the end walls 16 and 17 so as to prevent electromagnetic coupling between the input circuit and the output circuit. In the example of FIG. 3, the electromagnetic wave-absorbing sheet 7 is disposed on the ceiling 15.

DETAILED EXPLANATION OF THE PREFERRED EMBODIMENTS

The electromagnetic wave-absorbing sheet disposed in the case may be, as described above, a sheet of matrix rubber or plastics in which a powder selected from the group consisting of carbon powder, ferrite powder and soft magnetic metal powders.

An example of a metal powder-dispersed sheet, which exhibits the best result, is a sheet made by mixing Fe-7Cr-9Al alloy powder in polyethylene chloride rubber in an amount of 15–45 vol. % of the mixture, and rolling the mixture to form a sheet of 0.5–1.5 mm thick As the soft magnetic metal powder further to the above Fe—Cr—Al alloy powder any powder of metals such as PC Permaloy, Fe—Cr alloys, Fe—Si alloys, Fe—Si—Al alloys, Fe—Co alloys and Fe—Ni alloys can be used. The metal powder can easily be prepared by atomizing molten metal. As the matrix rubber, polyethylene chloride, acryl rubbers and ethylene-acryl rubbers are preferable.

Figure 9:
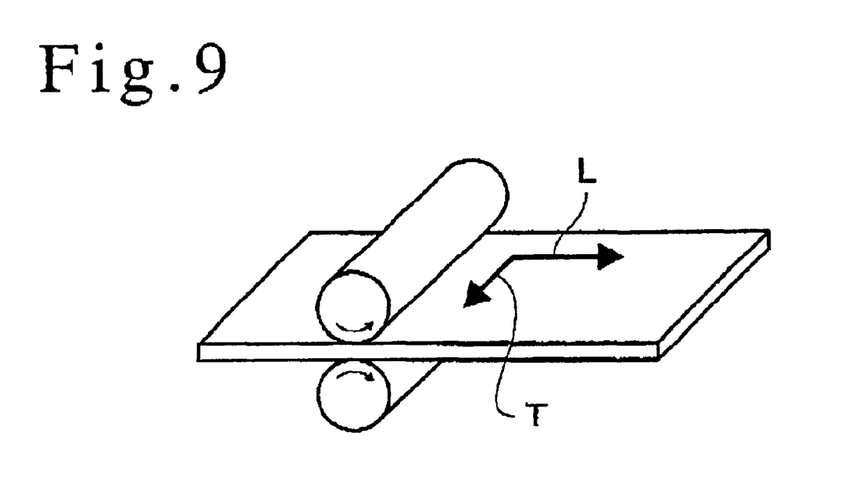
FIG. 9 is a perspective view showing the longitudinal direction (direction-L) or rolling direction and the traverse direction (direction-T) at the production of metal powder-dispersed sheet used in the present invention.

In case where a metal powder-dispersed sheet is used as the electromagnetic wave-absorbing sheet, as noted above, there is a suitable range of combination of the thickness of the sheet and the filling rate of the soft magnetic metal powder (vol. %). Also, in case where the sheet is made by rolling, as also noted above, some difference in electromagnetic wave-absorption characteristics depending on the direction of sheet disposition is observed. FIG. 9 shows the direction of rolling (direction-L) and the traverse direction (direction-T).

EXAMPLES

Three kinds of electromagnetic wave-absorbing sheets mentioned below were prepared. As the matrix material, "Elaslene", a polyethylene chloride (produced by Showa Denko K.K.) was used and the rubber was mixed with the powders mentioned below in a kneader and then rolled with calendar rolls to form sheets.

Carbon Powder-dispersed Sheets:
  graphite powder of averaged particle size about 1 $\mu$m,
  mixing rate 0.1–30 vol. %, thickness of sheets 0.5–1.5 mm Ferrite Powder-dispersed Sheets:
  ferrite powder of averaged particle size about 1 $\mu$m,
  mixing rate 5–50 vol. %, thickness of sheets 0.6–1.5 mm Metal Powder-dispersed Sheets:
  nearly spherical powder prepared by atomizing molten Fe-7Cr-9Al by water spray, averaged particle size about 15 $\mu$m,
  mixing rate 5–50 vol. %, thickness of sheets 0.5–1.5 mm A box was prepared using an aluminum alloy board of 5 mm thick with inner dimensions of 60 mm long(c), 23 mm wide(a) and 11 mm high (b). A lid of the same material having the same length and width was also prepared to form the case of HF amplifier. In FIG. 4, the dimension "$d_1$"stands for the thickness of the insulating board 5, and "$d_3$", for the thickness of the electromagnetic wave-absorbing sheet disposed on the ceiling.

On the bottom of this case a dielectric, insulating board made of PPO (polyoxyphnylene) resin was disposed, on which microstrip lines equivalent to the input circuit and the output circuit were provided. An input lead and an output lead for the amplifying element were extended outside through both the end walls of the case The electromagnetic wave-absorbing sheet prepared above was adhered on the ceiling of this case.

Using the above dummy HF amplifier the extent of decoupling at 5–13 GHz was determined. In FIG. 4, the amplifying element shown with broken lines is a dummy one and the coupling between the microstrip lines equivalent to the input and output circuits. More specifically, port 1 and port 4 were connected to no reflection terminals (50 Ω) and port 2 and port 3 were connected to a "Network Analyzer" to measure the extent of coupling "S23". Prevention of coupling or decoupling means decrease of this S23 value by disposing various electromagnetic wave-absorbing sheets. The lower the measured S23 value is, the higher the decoupling effect is. Here, "$S23_{max}$" is the maximum value of the S23 observed in the range of 5–12 GHz. The $S23_{max}$ is the extent of decoupling effected by the electromagnetic wave-absorption.

Figure 10:
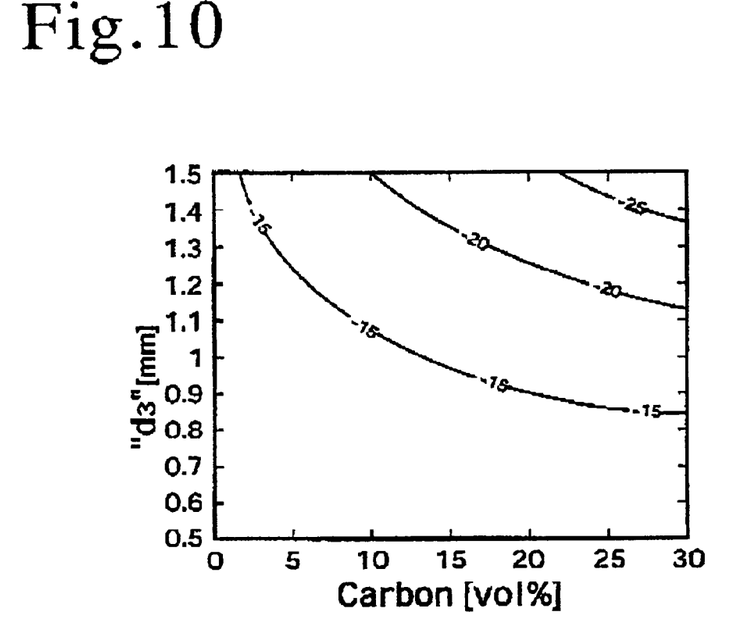
FIG. 10 is a graph showing the effect of decoupling in the present HF amplifier using a carbon powder-dispersed sheet, expressed by the relation between the filling rate of the carbon powder and the thickness of the sheet.
Figure 11:
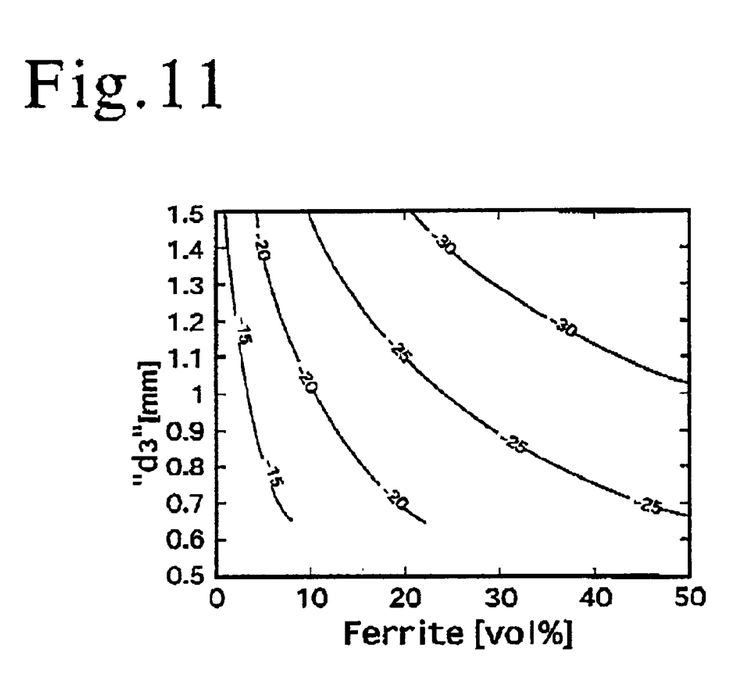
FIG. 11 is a graph showing the effect of decoupling in the present HF amplifier using a ferrite powder-dispersed sheet expressed by the relation between the filling rate of the ferrite powder and the thickness of the sheet.
Figure 12:
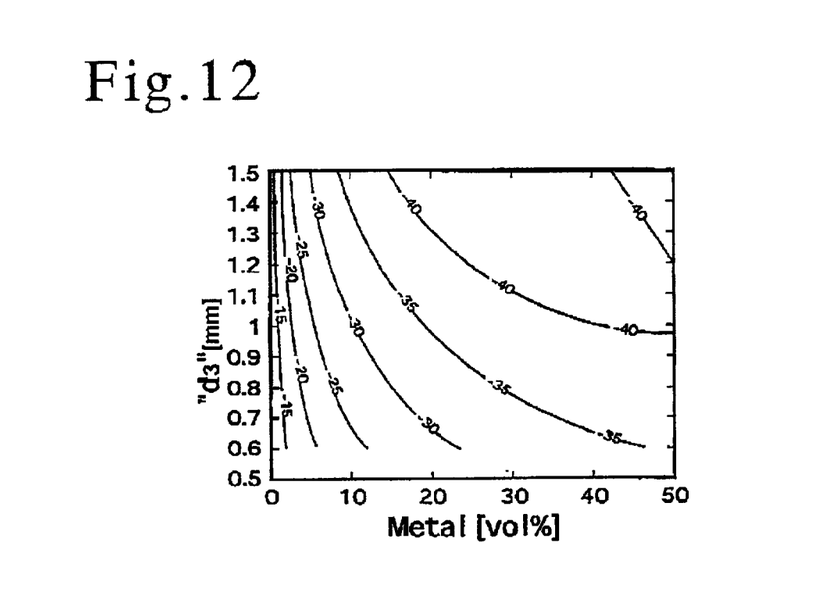
FIG. 12 is a graph showing the effect of decoupling in the present HP amplifier using a metal powder-dispersed sheet expressed by the relation between the filling rate of the metal powder and the thickness of the sheet.

The values of S23$_{max}$ (unit: dB) under various combinations of the powder filling rates and the thickness of the sheets are shown in FIG. 10 (carbon powder-dispersed), FIG. 11 (ferrite powder-dispersed) and in FIG. 12 (soft magnetic metal powder-dispersed) From these graphs it is evident that the decoupling effect can be obtained to the highest extent when the sheets of soft magnetic metal powder-dispersion are used. FIG. 12 shows that, on the decoupling effect, there are suitable regions in combinations of the powder filling rate and the thickness of the sheets.

Figure 13:
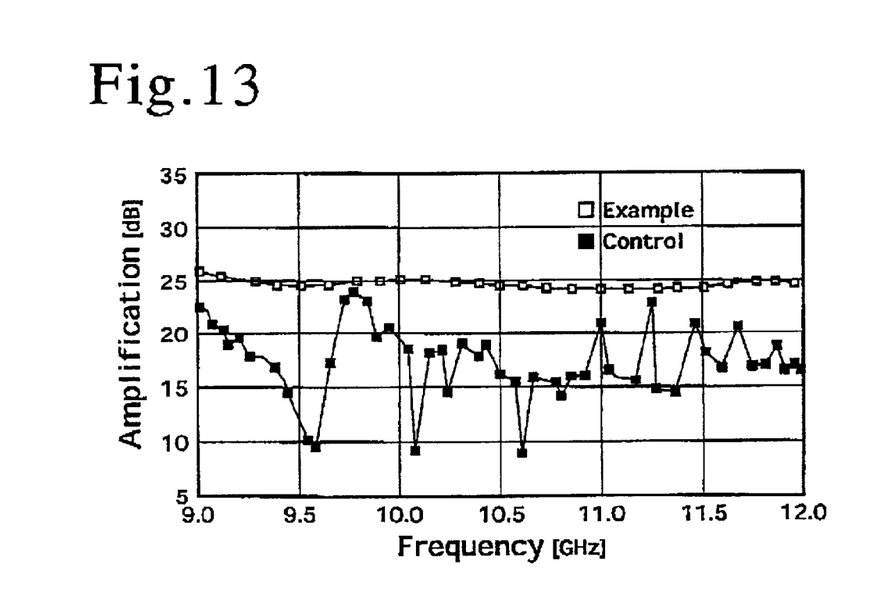
FIG. 13 is a graph showing the data of a working example of the invention in comparison with a control example, amplification rate achieved by an amplifier of gain 25 dB in the frequency range of 9–12 GHz.

A sheet prepared by dispersing the above mentioned Fe—Cr—Al alloy powder with powder filling rate 40 vol. %, thickness 1.0 mm was disposed on the ceiling of the above prepared case as the electromagnetic wave-absorbing sheet. An amplifying element of gain 25 dB was installed in this case and HF amplification at 9–12 GHz was carried out. The gain observed is shown in FIG. 13 in comparison the case without the decoupling means. In the control example gain decrease caused by coupling is remarkable, while in the example of this invention gain of 25 dB is maintained throughout the frequency range of testing.

In order to determine the effect of the rolling direction (direction-L) and the traverse direction (direction-T) at preparation of the metal powder-dispersed sheets described with reference to FIG. 9 on the electromagnetic wave-absorption performance, the above sheets prepared by dispersing the above Fe—Cr—Al alloy powder with powder filling rate 28 vol. % thickness 1.5 mm were used and disposed on various positions of inside the case as described below, and the decoupling effect was measured at the frequency range of 5–12 GHz. The results are shown in FIG. 14 through FIG. 21. The standards of direction of the sheets are, with respect to the ceiling and the side walls, longitudinal direction of the case, and with respect to the end walls, horizontal direction.

Figure 14:
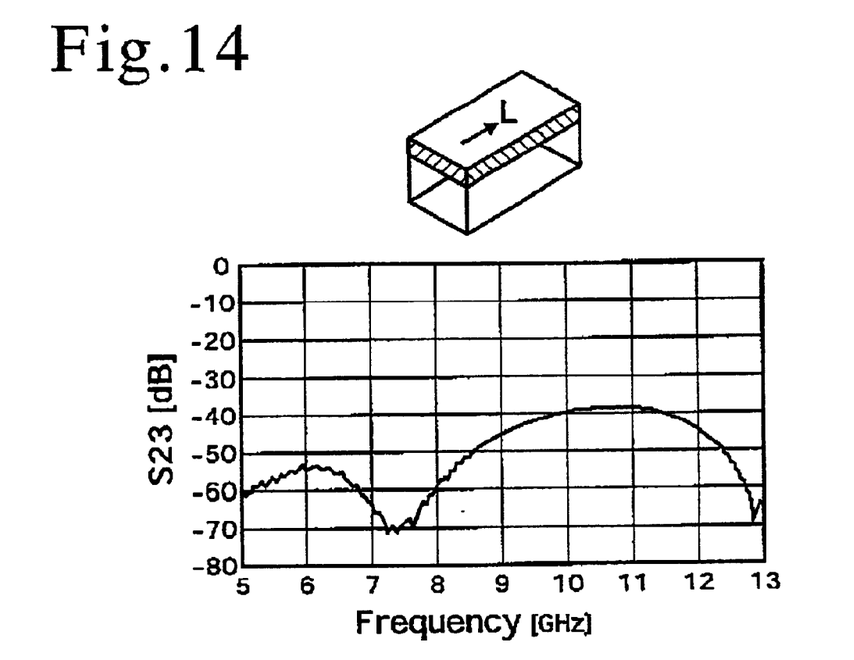
FIG. 14 is a graph showing the data of an example of the invention using a metal powder-dispersed sheet made by rolling, the effect of decoupling in connection with the direction of disposing the electromagnetic wave-absorbing sheet and the direction of rolling (ceiling only, direction-L) at 5–13 GHz.
Figure 15:
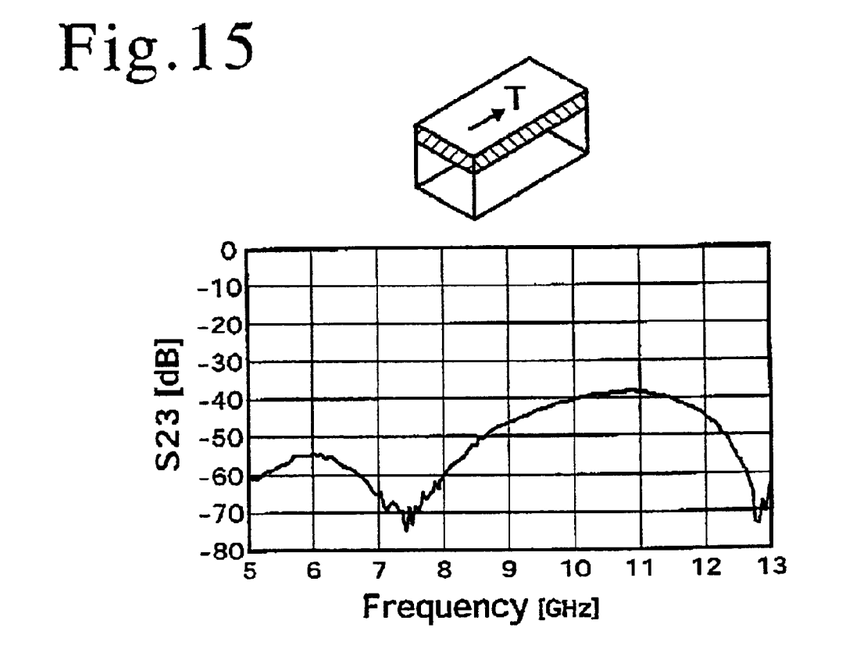
FIG. 15 is a graph similar to that of FIG. 14, (ceiling only, direction-T)
Figure 16:
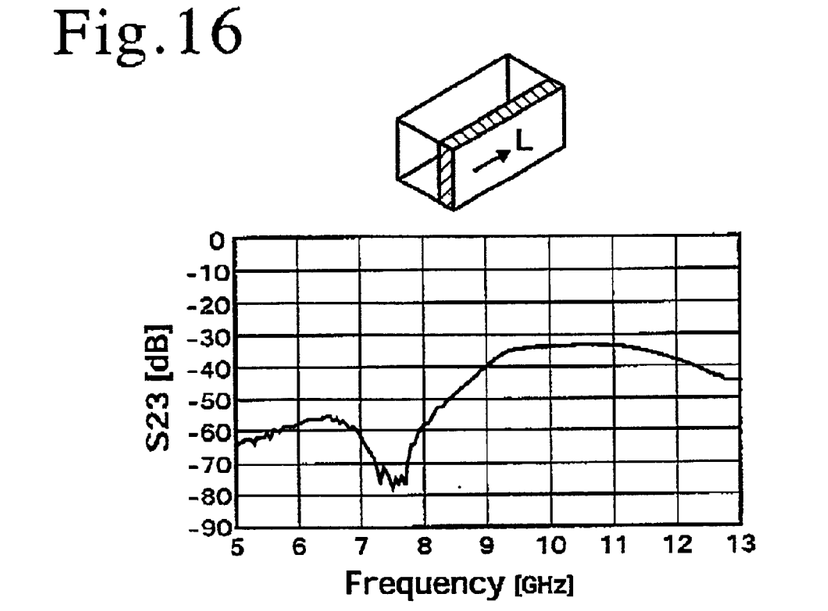
FIG. 16 is a graph similar to that of FIG. 14 (one side wall only, direction-L)
Figure 17:
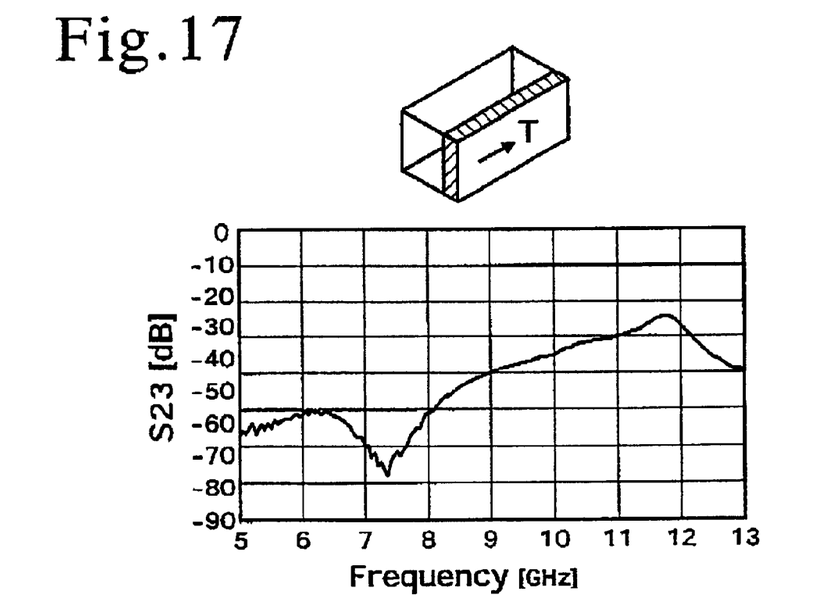
FIG. 17 is a graph similar to that of FIG. 14 (one side wall only, direction-T)
Figure 18:
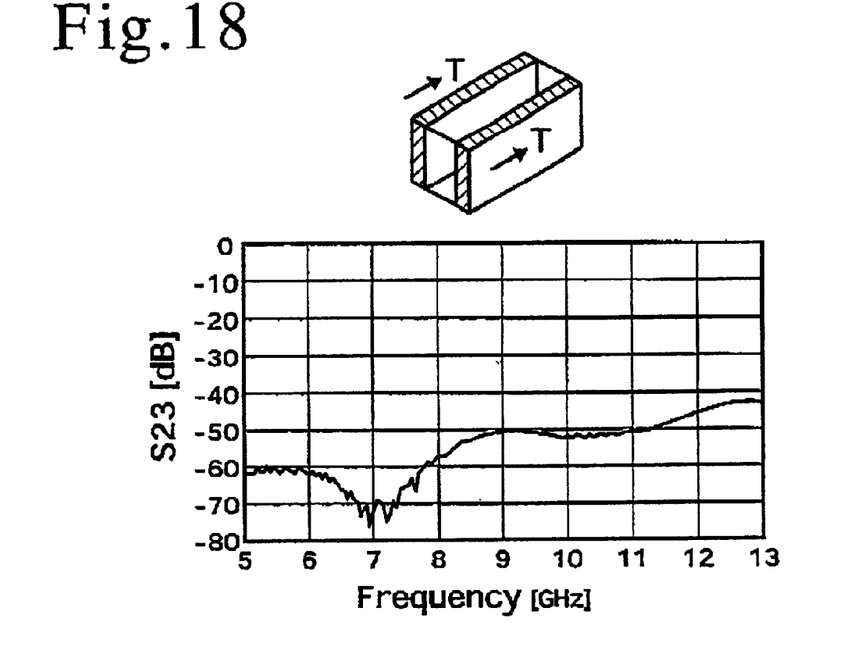
FIG. 18 is a graph similar to that of FIG. 14 (both side walls, both direction-T)
Figure 19:
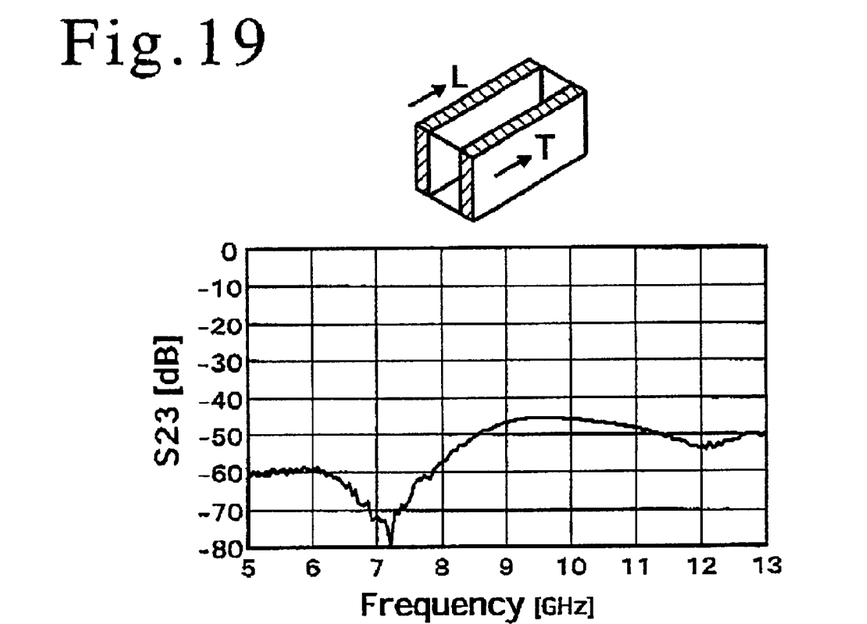
FIG. 19 is a graph similar to that of FIG. 14 (both side walls, directions-T and -L)
Figure 20:
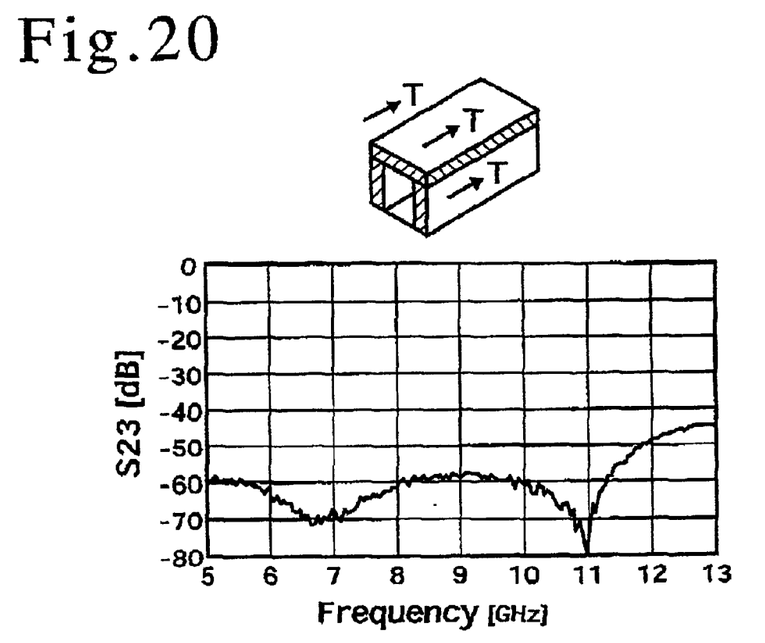
FIG. 20 is a graph similar to that of FIG. 14 (ceiling and both side walls, all directions-T)
Figure 21:
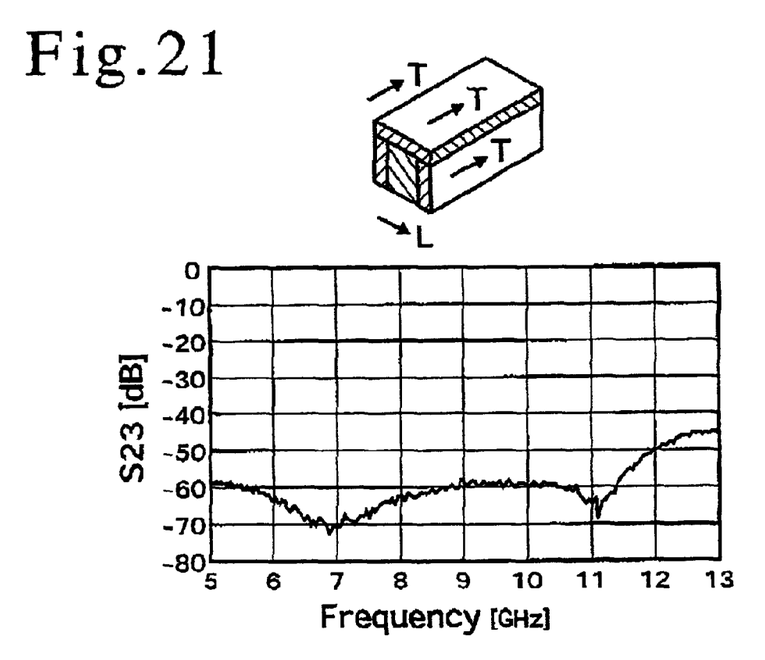
FIG. 21 is a graph similar to that of FIG. 14 (ceiling, both side walls, all direction-T; and both end walls, direction-L).

|         | Positions                                         | Sheet Direction                   |
|---------|---------------------------------------------------|-----------------------------------|
| FIG. 14: | ceiling                                          | L                                 |
| FIG. 15: | ceiling                                          | T                                 |
| FIG. 16: | one side wall                                    | L                                 |
| FIG. 17: | one side wall                                    | T                                 |
| FIG. 18: | both the side walls                              | T                                 |
| FIG. 19: | both the side walls                              | one L, one T                      |
| FIG. 20: | ceiling and both the side walls                  | all T                             |
| FIG. 21: | ceiling, both the side walls and both the end walls | ceiling and side walls T end walls L |

The above graphs give much suggestion on the means for decoupling between the input circuit and the output circuit. For example, the electromagnetic wave-absorbing sheet used has a peak absorption at 7–8 GHz, while in case where the sheet is disposed in the manner illustrated in FIG. 19 to FIG. 21 another peak absorption at 11–12 GHz also appears. Thus, the peak absorption can be controlled to some extent by choosing particle size and aspect ratio of the soft magnetic metal powder used, filling rate into the matrix and thickness of the sheet. Further conclusions are that the disposition on the ceiling is so effective in decoupling that using only one sheet gives sufficient effect; that, in the disposition on the side wall or walls, use of two sheets will be of course more effective than use of one sheet; and that the curves of the graphs showing the frequency characteristics are different depending on the relation of the rolling/traverse direction of the sheets disposed and the signal propagation; and that disposition on ceiling and both the side walls results in high decoupling effect.

As described above the HF amplifier of the invention is an HF amplifier to be used in the frequency range of 6–12 GHz, in which coupling of the input circuit and the output circuit is effectively prevented and thus, high gain can easily be achieved. The invention makes it possible to design electromagnetic wave-absorbing sheets exhibiting performance in accordance with the desired decoupling effect and the desired peak absorption frequency.

I claim:

1. A high-frequency amplifier with electromagnetic decoupling, which comprises a metal case consisting of a box container and a lid; the box container having first and second end walls, first and second side walls and a ceiling; an amplifying element installed on a dielectric board in the box container; leads connected to an input circuit and an output circuit of the amplifying element and extending outside through both the first and second end walls of the box container; and means for preventing electromagnetic coupling between the input circuit and the output circuit; the means including at least one electromagnet wave-absorbing sheet that absorbs electromagnetic waves in a frequency range of 5–13 GHz arranged inside at least one of the end walls, side walls and ceiling of the box container of the metal case, and the electromagnetic wave-absorbing sheet comprising a metal powder-dispersed sheet prepared by dispersing a soft magnetic metal material in a rubber matrix.

2. The high-frequency amplifier according to claim 1, wherein the metal powder-dispersed sheet is prepared by mixing a metal powder of Fe-7Cr-9Al with a chlorinated polyethylene rubber to form a mixture having an amount of 15–45 vol. % or the metal powder in the mixture, and rolling the mixture in a rolling direction to form a sheet of thickness 0.5–1.5 mm.

3. The high-frequency amplifier according to claim 1, wherein the electromagnetic wave-absorbing sheet is disposed inside or the ceiling of the box container.

4. The high-frequency amplifier according to claim 3, wherein:

the electromagnetic wave-absorbing sheet comprises a metal powder-dispersed sheet prepared by dispersing a metal powder of Fe-7Cr-9Al with a chlorinated polyethylene rubber to form a mixture having an amount of 15–45 vol. % of the metal powder in the mixture, and rolling the mixture in a rolling direction to form a sheet of thickness 0.5–1.5 mm, and the electromagnetic wave-absorbing sheet is disposed in such a manner that the rolling direction of the metal powder-dispersed sheet is in a direction of signal propagation.

5. The high-frequency amplifier according to claim 3, wherein:

the electromagnetic wave-absorbing sheet comprises a metal powder-dispersed sheet prepared by dispersing a metal powder of Fe-7Cr-9Al with a chlorinated polyethylene rubber to form a mixture having an amount of 15–45 vol. % of the metal powder in the mixture, and rolling the mixture in a rolling direction to form a sheet of thickness 0.5–1.5 mm, and the electromagnetic wave-absorbing sheet is disposed in such a manner that a transverse direction of the rolling direction of the metal powder-dispersed sheet is in a direction of the signal propagation.

6. The high-frequency amplifier according to claim 1, wherein the electromagnetic wave-absorbing sheet in disposed inside of one of the first and second side walls of the box container.

7. The high-frequency amplifier according to claim 6, wherein:
   the electromagnetic wave-absorbing sheet comprises a metal powder-dispersed sheet prepared by dispersing a metal powder of Fe-7Cr-9Al with a chlorinated polyethylene rubber to form a mixture having an amount of 15–45 vol. % of the metal powder in the mixture, and rolling the mixture in a rolling direction to form a sheet of thickness 0.5–1.5 mm, and
   the electromagnetic wave-absorbing sheet is disposed in such a manner that the rolling direction of the metal powder-dispersed sheet is in a direction of signal propagation.

8. The high-frequency amplifier according to claim 6, wherein:
   the electromagnetic wave-absorbing sheet comprises a metal powder-dispersed sheet prepared by dispersing a metal powder of FC-7Cr-9Al with a chlorinated polyethylene rubber to form a mixture having an amount of 15–45 vol. % of the metal powder in the mixture, and rolling the mixture in a rolling direction to form a sheet of thickness 0.5–1.5 mm, and
   the electromagnetic wave-absorbing sheet is disposed in such a manner that a traverse direction of the rolling direction of the metal powder-dispersed sheet is in a direction of signal propagation.

9. The high-frequency amplifier according to claim 1, wherein the electromagnetic wave-absorbing sheet is disposed inside both the first and second side walls.

10. The high-frequency amplifier according to claim 9, wherein:
    the electromagnetic wave-absorbing sheets comprise a metal powder-dispersed sheet prepared by dispersing a metal powder of Fe-7Cr-9Al with a chlorinated polyethylene rubber to form a mixture having an amount of 15–45 vol. % of the metal powder in the mixture, and rolling the mixture in a rolling direction to form a sheets of thickness 0.5–1.5 mm, and
    the electromagnetic wave-absorbing sheets are disposed in such a manner that a rolling direction of the metal powder-dispersed sheets is in a direction of signal propagation.

11. The high-frequency amplifier according to claim 9, wherein:
    the electromagnetic wave-absorbing sheets comprise a metal powder-dispersed sheet prepared by dispersing a metal powder of Fe-7Cr-9Al with a chlorinated polyethylene rubber to form a mixture having an amount of 15–45 vol. % of the metal powder in the mixture, and rolling the mixture in a rolling direction to form a sheets of thickness 0.5–1.5 mm, and
    the electromagnetic wave-absorbing sheets are dispensed in such a manner that a traverse direction of a rolling direction of the metal powder-dispersed sheets is in a direction of signal propagation.

12. The high-frequency amplifier according to claim 1, wherein:
    the electromagnetic wave-absorbing sheets comprise a metal powder-dispersed sheet prepared by dispersing a metal powder of Fe-7Cr-9Al with a chlorinated polyethylene rubber to form a mixture having an amount of 15–45 vol. % of the metal powder in the mixture, and rolling the mixture in a rolling direction to form a sheets of thickness 0.5–1.5 mm, and
    the electromagnetic wave-absorbing sheets are disposed in such a manner that the rolling direction of one the illegal powder-dispersed sheets and a traverse direction of the rolling direction of another of the metal powder-dispersed sheets are in a direction of signal propagation.

13. The high-frequency amplifier according to claim 1, wherein the electromagnetic wave-absorbing sheet is disposed inside of the ceiling and one of the first and second side walls.

14. The high-frequency amplifier according to claim 1, wherein the electromagnetic wave-absorbing sheet is disposed inside of the ceiling and both of the first and second side walls.

15. The high-frequency amplifier according to claim 14, wherein:
    the electromagnetic wave-absorbing sheets comprise it metal powder-dispersed sheet prepared by dispersing a metal powder of Fe-7Cr-9Al with a chlorinated polyethylene rubber to form a mixture having an amount of 15–45 vol. % of the metal powder in the mixture, and rolling the mixture in a railing direction to form a sheets of thickness 0.5–1.5 mm, and
    the electromagnetic wave-absorbing sheets are disposed in such a manner that time rolling directions of the three sheets are in a direction of the sign at propagation.

16. The high-frequency amplifier according to claim 1, wherein the electromagnetic wave-absorbing sheet is disposed inside of the ceiling, both the first and second side walls, and both the first and second end walls.

17. The high-frequency amplifier according to claim 13, including five of the electromagnetic sheets, wherein:
    the electromagnetic wave-absorbing sheets comprise a metal powder-dispersed sheet prepared by dispersing a metal powder of Fe-7Cr-9Al with a chlorinated polyethylene rubber to farm a mixture having an amount of 15–45 vol. % of the metal powder in the mixture, and rolling the mixture irk a rolling direction to form a sheets of thickness 0.5–1.5 mm, and
    the electromagnetic wave-absorbing sheets are disposed in such a manner that a transverse direction of the rolling direction of the metal powder-dispersed sheets on the ceiling and both the first and second side walls are in a direction of signal propagation.

* * * * *